(12) United States Patent
Rutten et al.

(10) Patent No.: US 7,248,194 B2
(45) Date of Patent: Jul. 24, 2007

(54) BIT-DETECTION ARRANGEMENT AND APPARATUS FOR REPRODUCING INFORMATION

(75) Inventors: Albertus Johannes Antonius Rutten, Eindhoven (NL); Nicolaas Johannes Hendricus Maria Van Beurden, Tilburg (NL); Josephus Arnoldus Henricus Maria Kahlman, Eindhoven (NL); Albert Hendrik Jan Immink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 37 days.

(21) Appl. No.: 10/558,712

(22) PCT Filed: May 25, 2004

(86) PCT No.: PCT/IB2004/050771

§ 371 (c)(1),
(2), (4) Date: Nov. 29, 2005

(87) PCT Pub. No.: WO2004/109927

PCT Pub. Date: Dec. 16, 2004

(65) Prior Publication Data

US 2007/0008204 A1      Jan. 11, 2007

(30) Foreign Application Priority Data

Jun. 4, 2003   (EP)   .................................. 03101620

(51) Int. Cl.
   H03M 1/00   (2006.01)
(52) U.S. Cl. ...................... 341/155; 369/59.2; 375/340
(58) Field of Classification Search ............... 341/155; 375/240; 369/59.2
See application file for complete search history.

(56) References Cited

U.S. PATENT DOCUMENTS

| 5,663,945 A * | 9/1997 | Hayashi et al. ........... 369/47.35 |
| 5,812,508 A * | 9/1998 | Moon ....................... 369/59.22 |
| 2003/0117925 A1* | 6/2003 | Tonami .................... 369/59.22 |
| 2005/0018776 A1* | 1/2005 | Kahlman ..................... 375/247 |

FOREIGN PATENT DOCUMENTS

EP          0 342 736 A1      11/1989

* cited by examiner

Primary Examiner—Howard L. Williams
(74) Attorney, Agent, or Firm—Michael E. Marion

(57) ABSTRACT

Disclosed is a bit-detection arrangement able to convert an analog signal (AS) having an amplitude into a digital signal (DS) representing a bit sequence from which the analog signal (AS) is derived. The bit-detection arrangement has a phase detector which detect the phase difference between a quantized analog signal and a clock signal $C_2$. The phase difference is sampled by an AD converter. The AD converter can sample at a relatively slow rate as the phase difference is a low frequency signal. The sampled phase difference is fed to a digital PLL which outputs a phase signal PHI. The phase signal and the quantized analog signal are used to recreate the digital signal (DS). The current invention is characterized in that the bit decision unit further comprises—at least one additional sample and hold unit $SH_2$ able to sample the output signal $S_1$, using a clock signal $C_{SH2}$ and wherein the frequency of the clock signal $C_{SH2}$ is equal to the frequency of clock signal $C_{SH1}$ and the phase of clock signal $C_{SH2}$ is substantially different from the phase of clock signal $C_{SH1}$, and an output unit for outputting samples of either the sample and hold units $SH_1$ or $SH_2$, wherein the samples of the sample and hold unit $SH_1$ are outputted when the phase signal $PH_1$ indicates that the phase difference $\Delta P_1$ is in a first region and the samples of the additional sample and hold unit $SH_2$ are outputted when the phase signal $PH_1$ indicates that the phase difference $\Delta P_1$ is in a second region. This has the advantage that the change of bit errors occurring in the presence of phase jitter is reduced.

6 Claims, 10 Drawing Sheets

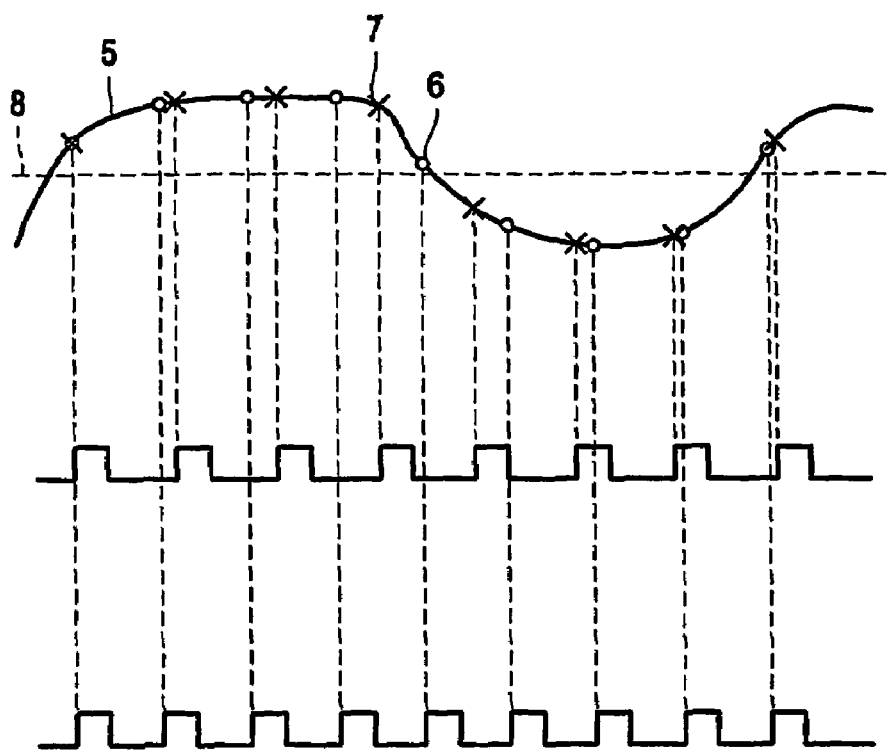
FIG. 2A
FIG. 2B
FIG. 2C
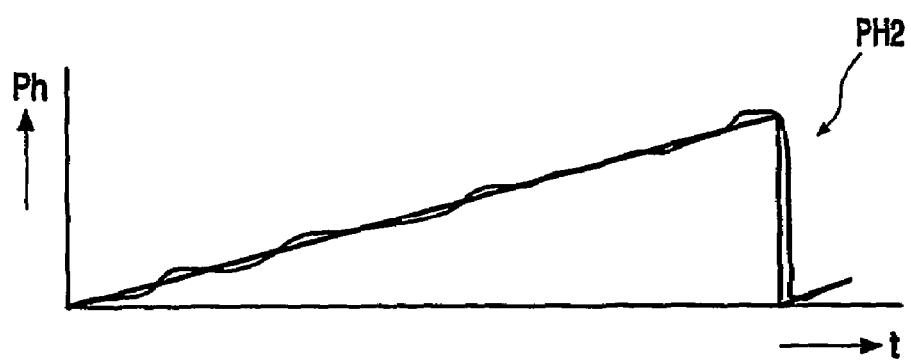
FIG. 2D
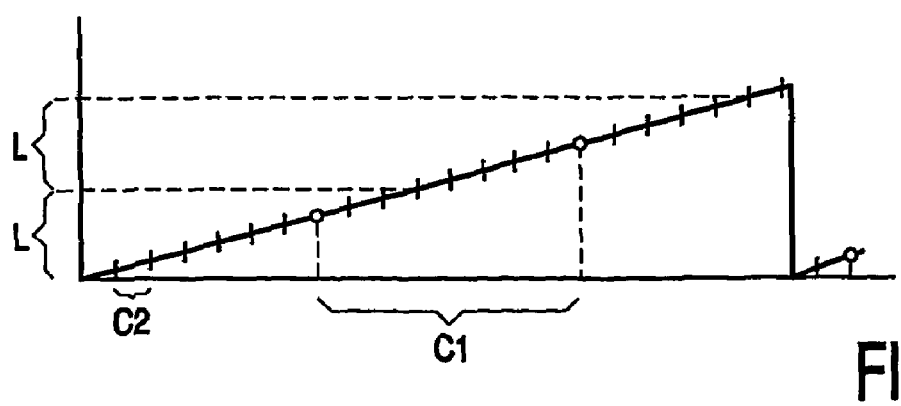
FIG. 3

BIT-DETECTION ARRANGEMENT AND APPARATUS FOR REPRODUCING INFORMATION

This application is a 371 of PCT/IB04/50771 May 25, 2004 EUROPEAN PATENT OFFICE (EPO) 031016207 Jun. 4, 2003.

The invention relates to a bit-detection arrangement able to convert an analog signal having an amplitude into a digital signal representing a bit sequence from which the analog signal is derived, comprising:

a quantizer able to produce an output signal $S_1$ by quantizing the amplitude of the analog signal, and a phase detector $PD_1$ able to determine a phase difference $\Delta P_1$ between the output signal $S_1$ and a clock signal $C_2$, and able to generate an output signal $PH_2$ having an amplitude, where the amplitude of $PH_2$ indicates the phase difference $\Delta P_1$, an analog to digital converter ADC which is able to output a processed signal by sampling the output signal $PH_2$ at a sample rate controlled by a clock signal $C_1$ having a frequency which is equal to the frequency of clock signal $C_2$ divided by a factor n, a digital phase locked loop DPLL able to lock on the processed signal and able to output a phase signal $PH_1$ using the clock signal $C_1$, and a bit decision unit able to output the digital signal and a clock signal $C_3$ using the phase signal $PH_1$, the clock signal $C_1$ and the output signal $S_1$, comprising a sample and hold unit $SH_1$ able to sample the output signal $S_1$, using a clock signal $C_{SH1}$ having a frequency equal to the frequency of clock signal $C_2$, and to hold n samples, $sample_{y=1}$ through $sample_{y=n}$, of the output signal $S_1$ for a clock period of clock signal $C_1$, n being the division factor of clock signal $C_2$, where n is an integer greater than one.

The invention also relates to an apparatus for reproducing information recorded on an information carrier, having such a bit-detection arrangement.

From European Patent Application 0342736 a bit-detection arrangement is known which converts the analog signal into the processed signal by using the analog to digital converter ADC of the preprocessing unit. The processed signal thus comprises samples of the analog signal. The analog to digital converter ADC is controlled by the clock signal $C_1$, which has a frequency of approximately the bit rate or greater of the bit sequence from which the analog signal is derived. The bits in the bit sequence will hereinafter also be referred to as channel bits. The bit rate of the channel bits in the analog signal will hereinafter also be referred to as the channel bit rate, or the channel bit frequency. The digital PLL is able to output the phase signal $PH_1$ which indicates the phase difference between output signal $S_1$ and clock signal $C_2$. The bit decision unit is able to determine a first crossing with a predetermined level of the phase signal $PH_1$, and is able to output the digital signal by determining a sign of a sample of the analog signal at an instant in time in the neighborhood of the first crossing by using the processed signal. Therefore, in this case, the processed signal is used as signal $S_1$ mentioned in the opening paragraph. The bit decision unit is able to output the clock signal $C_3$ which is synchronous with the digital data. Clock signal $C_3$ is derived from the phase signal $PH_1$. Clock signal $C_3$ is used to clock out the correct bits at the correct moments. The known bit-detection arrangement also comprises an interpolator which determines the phase difference between a zero crossing of the clock signal $C_1$ and a zero crossing of the processed signal. According to this phase difference the phase of the processed signal is corrected and subsequently fed to the digital PLL.

It is apparent that the analog to digital converter ADC has to sample at a rate determined by the channel bit rate. With increasing demands on the channel bit rate, the analog to digital converter ADC also has to sample at increasing rates. It is a drawback of the known bit-detection arrangement that it is not able to process analog signals with relatively high channel bit rates. Furthermore, an analog to digital converter ADC that can sample with relatively high sample rates is relatively expensive. Also the speed at which the digital PLL operates is determined by the channel bit rate, and therefore the demands on the digital PLL become higher with increasing channel bit rates.

Also an embodiment of a bit-detection arrangement is described in the not previously published PCT application IB02/04486 (PHN 14.010), further referred to as D1. The bit-detection arrangement described in D1 works as follows.

The output signal $PH_2$ of the phase detector $PD_1$ has a relatively low frequency if the difference of the frequency of the clock signal $C_2$ and the output signal $S_1$ is relatively small. Therefore the analog to digital converter ADC can sample at a relatively slow rate, and thus the ADC may be a relatively simple and inexpensive one. For this reason the clock signal $C_1$ may have a lower frequency thin clock signal $C_2$, in fact clock signal $C_1$ is derived from clock signal $C_2$ by dividing the frequency of clock signal $C_2$ by a factor n. The analog to digital converter ADC is able to use the clock signal $C_1$ to control the sample rate, resulting in the processed signal.

The quantizer quantizes the analog signal. A common used quantizer is a threshold detector. The threshold detector converts the analog signal into a digital signal. If the analog signal is above a predetermined threshold level, then the output signal $S_1$ has a value 1. Otherwise the output signal has a value 0. The sample and hold unit now can sample these 0's and 1's. Also the phase detector $PD_1$ can be implemented digitally, which has great advantages in that the phase detector is easily scalable, i.e. it automatically scales with changing clock pulse.

The bit decision unit is able to use the phase signal $PH_1$ to produce the digital signal which is synchronous in relation to the channel bits, thereby being able to use the clock signal $C_1$ to output the digital signal. The sample and hold unit is capable of holding n samples. This unit is read out every cycle of clock signal $C_1$, and during each cycle of clock signal $C_1$ there are n cycles of clock signal $C_{SH1}$. The n samples comprise a number of channel bits which number is dependent on the ratio of the channel bit frequency and the frequency of clock signal $C_2$. For instance, if the frequency of clock signal $C_2$ is approximately equal to the channel bit frequency, then the n samples comprise n channel bits. If the frequency of clock signal $C_{SH1}$ is one and a half times the channel bit frequency, then the n samples comprise 2n/3 channel bits. If, with this ratio, n equals 3, then 3 samples contain 2 channel bits.

So, one sample may contain a duplicate value of a channel bit which is already represented by an other sample. If the phase difference exceeds a predetermined value, then the corresponding sample is the sample that may contain a duplicate value and the bit decision unit may decide not to output that sample in the digital signal. The decision not to output a sample will hereinafter also be referred to as discarding a sample. Because the amplitude of the processed signal represents the phase difference, it can be determined from the processed signal which sample to discard. Because the digital phase locked loop locks to the processed signal, also signal $PH_1$ may be used for determining which sample to use and which sample to discard. Initial, the phase difference and thus the amplitude of $PH_1$ may start from zero. When the amplitude exceeds a predetermined value then a corresponding sample may be discarded. The corresponding sample may be the sample closest to the point in time where the predetermined value is crossed. After that crossing, every time a multiple of the predetermined value is crossed, a corresponding sample may be discarded.

If the frequency of clock signal $C_2$ is approximately equal to the channel bit frequency, then the frequency of the processed signal is relatively low. Then also $PH_1$ has a relatively low frequency. Because the amplitude of $PH_1$ is only known at sampling instants determined by clock signal $C_1$, the amplitudes of $PH_1$ corresponding to the samples of $S_1$ have to be determined, e.g. by interpolating the amplitude at the n sampling instants. This results in the amplitude of $PH_1$ at n points between each cycle of clock signal $C_1$. If the amplitude of $PH_1$ at one of the n points exceeds a multiple of the predetermined value, then the corresponding sample of $S_1$ may be discarded.

If the frequency of $PH_1$ is relatively low, then the moments at which the amplitude of $PH_1$ exceeds a multiple of the predetermined value are relatively rare. This results in almost every sample of $S_1$ being outputted into the digital signal. This is the desired result, because when the frequency of $PH_1$ is relatively low, the frequency of the clock signal $C_2$ and the channel bit rate is approximately the same. If those frequencies are exactly the same, then all samples are outputted.

If the frequency of $PH_1$ is relatively high, then the moments at which the amplitude of $PH_1$ exceeds a multiple of the predetermined value are relatively frequent. This results in a smaller number of samples of $S_1$ being outputted into the digital signal between two subsequent cycles of clock signal $C_1$.

If n equals one, then the analog to digital converter ADC samples at the same speed as the analog to digital converter ADC of the known bit detection arrangement. Thus when n equals one the objective of the invention is not achieved. The clock signal that is fed to the digital phase locked loop DPLL and the bit decision unit does not explicitly has to be clock signal C1. A clock signal that fulfills the Nyquist criterion for the processed signal will suffice. Because clock signal C2 always has a higher rate than clock signal C1, clock signal C2 may be used instead of clock signal C1 in case of the digital phase locked loop DPLL and the bit decision unit.

With the bit detection arrangement described in D1, bits have to be discarded. This is due to the fact that the sample frequency always has to be higher than the channel bit frequency, resulting in too many output samples. Therefore bits have to be discarded. The method to discard bits works correctly for data without phase jitter, but bit errors occur when jitter is present. When the sample moments and bit decision moments exactly match, maximum phase jitter is allowed. When the sample moments are exactly in between two bit decision moments, no phase jitter is allowed.

It is a first object of the invention to provide a bit-detection arrangement of the kind described in the opening paragraph, wherein the allowable phase jitter is increased.

It is a second object of the invention to provide an apparatus for reproducing information recorded on an information carrier, which is provided with such a bit-detection arrangement.

The first object is realized in that the bit decision unit further comprises
at least one additional sample and hold unit $SH_2$ able to sample the output signal $S_1$, using a clock signal $C_{SH2}$ and wherein the frequency of the clock signal $C_{SH2}$ is equal to the frequency of clock signal $C_{SH1}$ and the phase of clock signal $C_{SH2}$ is substantially different from the phase of clock signal $C_{SH1}$, and
an output unit for outputting samples of either the sample and hold units $SH_1$ or $SH_2$, wherein the samples of the sample and hold unit $SH_1$ are outputted when the phase signal $PH_1$ indicates that the phase difference $\Delta P_1$ is in a first region and the samples of the additional sample and hold unit $SH_2$ are outputted when the phase signal $PH_1$ indicates that the phase difference $\Delta P_1$ is in a second region.

The bit detection arrangement according to the invention has at least two sample and hold units which sample the output signal $S_1$ and wherein one sample and hold unit uses clock signal $C_{SH1}$ to sample the output signal $S_1$ and one sample and hold unit uses clock signal $C_{SH2}$ to sample the output signal $S_1$. The clock signals $C_{SH1}$ and $C_{SH2}$ have the same frequency, but the phase of these clock signal is different. For instance the phase difference between clock signals $C_{SH1}$ and $C_{SH2}$ can be 180 degrees. If the phase signal $PH_1$ indicates that the phase difference between the clock signal $C_2$ and the output signal $S_1$ is around 0 degrees, than the samples of the sample and hold unit are outputted which is controlled with the clock signal having the smallest phase difference with clock signal $C_2$. If for instance clock signal $C_{SH1}$ has the same phase as clock signal $C_2$ then the samples of sample and hold unit $SH_1$ are outputted. In that case the clock signal $C_{SH2}$ can best be selected to have 180 degrees phase difference with clock signal $C_2$. Then, when the phase signal $PH_1$ indicates that the phase difference between the clock signal $C_2$ and the output signal $S_1$ is around 180 degrees, then the samples of the sample and hold unit $SH_2$ are outputted. This has the advantage that the phase jitter can be higher and still no bit errors occur. The first region in the above mentioned example is set to 0 to 90 degrees, and the second region to 90 to 180 degrees.

In a further embodiment of the bit-detection arrangement the bit decision unit further comprises sample and hold units $SH_3$ through $SH_x$, wherein the sample and hold units $SH_1$ through $SH_x$ are clocked by clock signals $C_{SH1}$ through $C_x$, wherein the frequency of the clock signals $C_{SH2}$ through $C_{SHx}$ is equal to the frequency of clock signal $C_{SH1}$ and the phases of the clock signals $C_{SH1}$ through $C_{SHx}$ are substantially different from each other and in that the output unit is adapted to output samples of the sample and hold units $SH_1$ through $SH_x$, wherein the phase signal $PH_1$ is divided into x regions, x being the number of sample and hold units, and wherein the output unit is able to output samples of the sample and hold unit which corresponds to the region in which the current value of the phase signal $PH_1$ resides.

This has the advantage that the sample of output signal $S_1$ are sampled more accurately, i.e. the sample moment is can be chosen optimal. In the case that there are only two sample and hold units the sample moment can be maximal 90 degrees from the optimal sample moment. This results in that the maximum allowed phase jitter is reduced. By having more sample and hold units, the sample moments can be chosen such that the maximum allowed phase jitter is increased compared to the embodiment with two sample and hold units.

In an other embodiment of the bit-detection arrangement according to the invention the bit detection unit further comprises a clock signal selection unit for outputting the clock signal $C_{SH1}$ and clock signal $C_{SH2}$ wherein the clock signal selection unit is able to change the phases of the clock signals $C_{SH1}$ and $C_{SH2}$ in dependence of the current value of the phase signal $PH_1$.

In this embodiment the phase of the clock signals $C_{SH1}$ and $C_{SH2}$ can be changed such that the sample moments are optimal with regard to the phase jitter. For instance, when the phase signal $PH_1$ indicates that the phase difference $\Delta P_1$ is between 0 and 45 degrees, the phase of the clock signal $C_{SH1}$ is set to 22.5 degrees, and sample and hold unit $SH_1$ is used to sample. If the phase signal $PH_1$ indicates that the phase difference $\Delta P_1$ is between 45 and 90 degrees the clock signal $C_{SH2}$ is set to 67.5 degrees, and hold unit $SH_1$ is used to sample. Then for 90 to 135 degrees the phase of clock signal $C_{SH1}$ is set to 112.5 degrees. Generally, the phase of the clock signal $C_{SH1}$ is set to the middle of the current region of the phase difference $\Delta P_1$. The phase of clock signal $C_{SH2}$ can already be set beforehand, so that at the moment the phase signal $PH_1$ indicates that the phase difference $\Delta P_1$ passes the 45 degrees, there can be directly switched from sample and hold unit $SH_1$ to sample and hold unit $SH_2$.

In a further embodiment the clock signal selection unit is fed with clock signals $C_{f1}$ through $C_{fx}$ having a frequency equal to clock signal $C_2$ and wherein the phases of the clock signals $C_{f1}$ through $C_{fx}$ differ from each other, and wherein the clock signal selection unit passes two of the clock clock signals $C_{f1}$ through $C_{fx}$ through as the clock signals $C_{SH1}$ and $C_{SH2}$ in dependence of the phase signal $PH_1$. In this embodiment the clock signal selection unit can easily change the phase of the clock signals $C_{SH1}$ and $C_{SH2}$ by selecting one of the clock signals $C_{f1}$ through $C_{fx}$.

Instead of having two sample and hold units it is possible to have only one sample and hold unit and still be able to change the phase at which samples are taken. In the embodiment with the clock signal selection unit the phase of the clock signal which clocks the one sample and hold unit, the phase is changed in dependence of the phase signal $PH_1$. Directly switching between sampling moments when the phase signal $PH_1$ passes a certain value is then not possible. The sample and hold unit has already taken some samples with the clock signal having the previous phase. There is thus some delay before samples are outputted from the sample and hold unit with the correct sample moments. This shows the advantage of having at least two sample and hold units.

The second object of the invention is realized in that the apparatus for reproducing information recorded on an information carrier is provided with the bit-detection arrangement according to the invention.

Such an apparatus generally also comprises:

a read head able to read information from the information carrier;

a displacement means able to cause a relative displacement between the information carrier and the read head;

a signal processing unit able to process a signal coming from the read head into the analog signal;

a channel decoding means able to decode the digital signal.

The apparatus for reproducing information on an information carrier is able to use a bit-detection arrangement having an analog to digital converter with a relative slow sampling rate.

These and other aspects of the bit-detection arrangement and of the apparatus for reproducing information according to the invention will be apparent from and elucidated by means of the drawings, in which:

FIG. 2a shows an example of the analog signal;

FIG. 2b shows a signal that represents the channel bit rate in the example of FIG. 2a;

FIG. 2c shows the clock signal C2 in the example of FIG. 2a;

FIG. 2d shows the output signal $PH_2$ in the example of FIG. 2a;

FIG. 3 shows an example of the processed signal in relation to the clock signals $C_1$ and $C_2$;

FIG. 10a shows an example of the phase difference $\Delta P1$;

FIG. 10b shows the output signal $PH_2$ when using the first inverting means in case of the phase difference $\Delta P1$ shown in FIG. 10a;

FIG. 10c shows an example of the control signal in case of the phase difference $\Delta P1$ shown in FIG. 10a;

FIG. 12a shows an example of the clock signal $C_{SH1}$;

FIG. 12b shows an example of the analog signal with sampling moments with respect to the clock signal $C_{SH1}$ of FIG. 13a;

FIG. 12c shows an example of the clock signal $C_{SH2}$;

FIG. 12d shows an example of the analog signal with sampling moments with respect to the clock signal $C_{SH2}$ of FIG. 13c;

FIG. 12e shows the phase signal $PH_1$ corresponding with FIGS. 12a to 12d;

Figure 1:
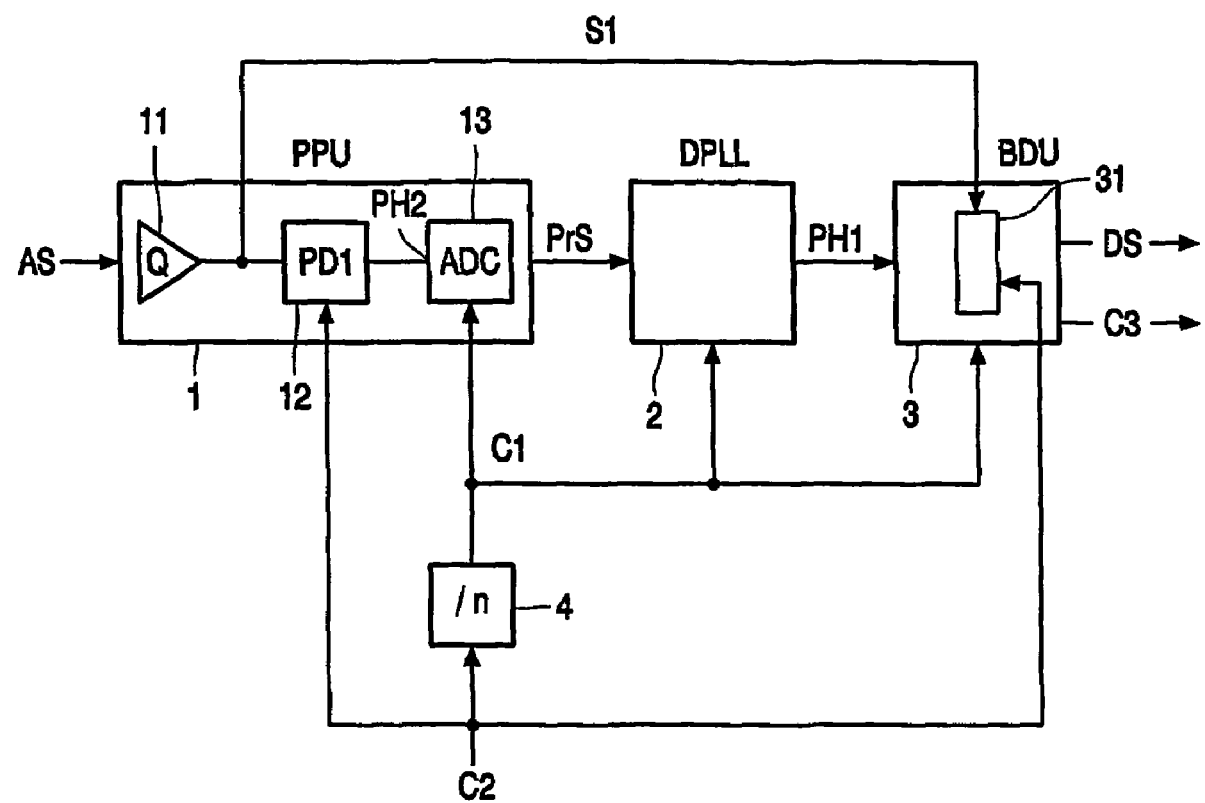
FIG. 1 shows an embodiment of the bit-detection arrangement described in not previously published PCT application IB02/04486.

In the embodiment of the bit-detection arrangement shown in FIG. 1 the analog signal AS is converted into the processed signal PrS by the preprocessing unit 1. The digital phase locked loop DPLL 2 locks on to the processed signal PrS and outputs a phase signal $PH_1$. The bit decision unit outputs the digital signal DS and the clock signal $C_3$ using the phase signal $PH_1$, the clock signal $C_1$ and the output signal $S_1$. The clock divider 4 produces the clock signal $C_1$ by dividing the frequency of clock signal $C_2$ by a factor n.

The quantizer 11 quantizes the amplitude of the analog signal AS and outputs the resulting signal $S_1$. The phase detector $PD_1$ 12 determines the phase difference $\Delta P_1$ between the output signal $S_1$ and the clock signal $C_2$ and feeds the output signal $PH_2$ to the ADC. The ADC then samples the output signal $PH_2$ at a rate controlled by the clock signal $C_1$. The sample and hold unit 31 samples the output signal $S_1$ to obtain binary samples using the clock signal $C_{SH1}$. Clock signal $C_{SH1}$ in this case is identical to the clock signal $C_2$. At the end of a clock cycle of clock signal $C_1$ the sample and hold unit 31 contains n samples. The bit decision unit may output all these samples at the beginning of the next cycle of clock signal $C_1$, or it outputs a smaller selection of these samples. Some samples may be discarded.

In FIG. 2a the analog signal AS 5 is shown together with a level 8. In the next example an embodiment of the quantizer 11 is a threshold detector. A threshold detector interprets samples as a logic 1 if the value of the sample is above a predetermined level, and as a logic 0 if the value of the sample is under a predetermined level. The level 8 shown in FIG. 2a is the predetermined level. The sampling moments of clock signal $C_2$ are indicated by the circles 6. The sampling moments of the original data is indicated by the crosses 7. In FIG. 2b the rising edges of the pulses indicate the sampling moments corresponding to the crosses 7, i.e. this signal represents the channel bit rate. The rising edges of the pulses in FIG. 2c indicate the sampling moments corresponding to the circles 6, i.e. this signal represents the clock signal $C_2$.

The channel bits contained in the analog signal AS of FIG. 2a are 1111 0001. The data that the sample and hold unit contains after sampling the output signal $S_1$ is 1111 1 0001. It is clear that one channel bit is sampled twice. In this case the fifth bit, i.e. $sample_{y=5}$, that the sample and hold unit 31 contains, may be discarded.

Further in FIG. 2d it is apparent that the output signal $PH_2$, indicated by the solid line, has a relatively low frequency compared to the channel bit rate. The ADC 13 may sample at a relatively low rate. The output signal $PH_2$ is noisy because of disturbance in the channel bit rate e.g. due to jitter, mastering clock variations, etc. and because the phase difference $\Delta P_1$ does not exactly have a linear course. Therefore also the processed signal $P_rS$ is noisy because it is a sampled version of the output signal $PH_2$. The digital PLL 2 smoothens the processed signal $P_rS$ in order to oppress these disturbances.

As can be seen from the FIGS. 2a to 2d, at a first point the phase difference between the clock signal $C_2$ and the channel bit rate becomes so great that one channel bit is sampled twice. This first point corresponds to a second point at which the amplitude of the output signal $PH_2$ crosses a predetermined value. Because ADC 13 samples at a clock cycle which is n times slower than the clock cycle of clock signal $C_2$, it is not clear from the processed signal PrS which of the n samples that the sample and hold unit 31 contains may be discarded. As shown in FIG. 3 however, the processed signal PrS may be interpolated to obtain information about which sample may be discarded. The first sample corresponding to the interpolation that is greater than the predetermined level L, may be discarded. A next sample may be discarded that has a corresponding interpolation that is greater than twice the predetermined value L. If the processed signal PrS at some point returns to zero, than of course the criterion for discarding the next sample is crossing the predetermined level L. In FIG. 3 $C_1$ and $C_2$ are the cycles of the corresponding clock signals. If the embodiment of the digital PLL 2 outputs a similar signal as the processed signal PrS, then instead of the processed signal PrS also the phase signal $PH_1$ may be used. In that case the interpolation may be done by the bit detection unit 3.

Figure 4:
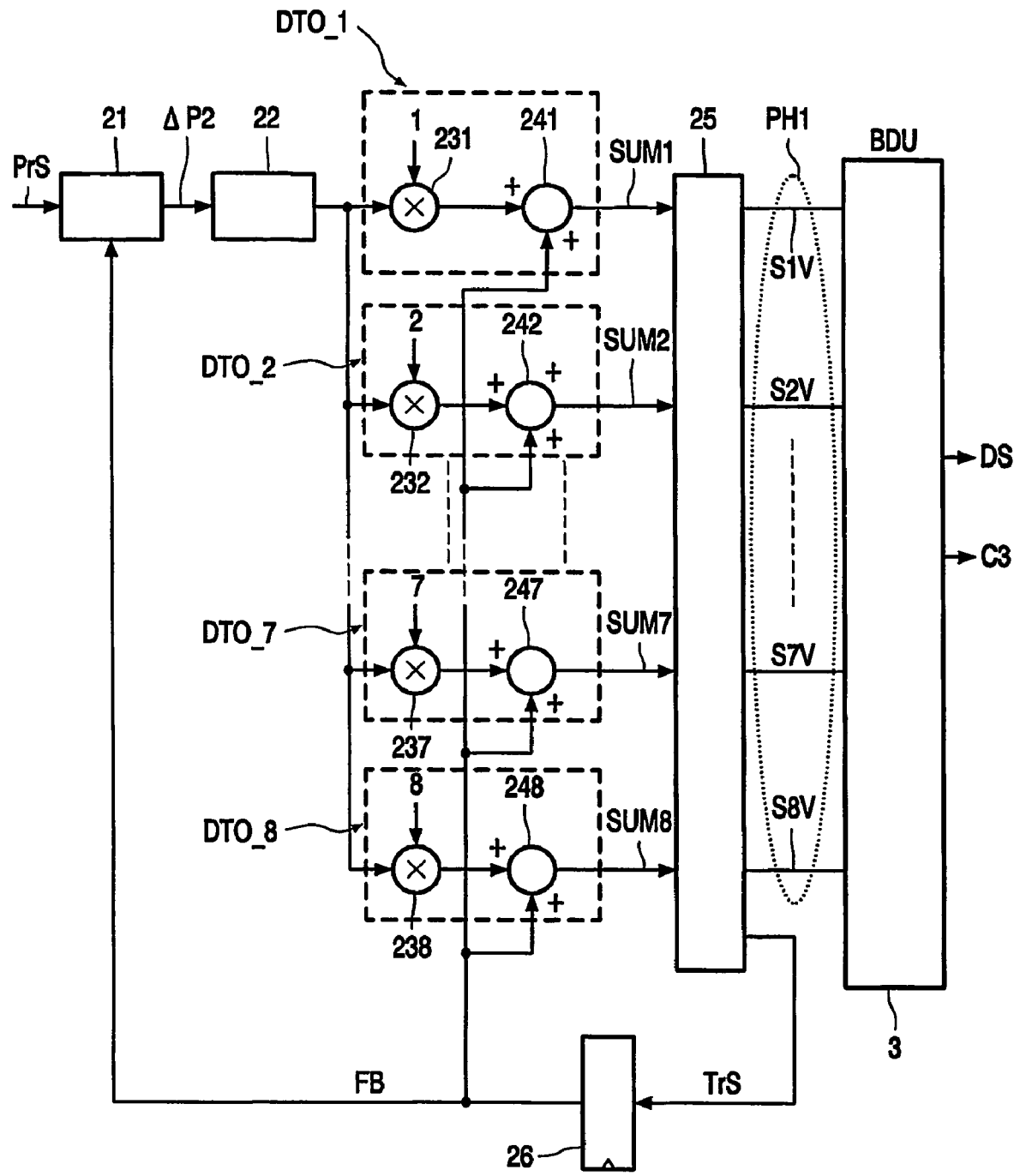
FIG. 4 shows an embodiment of a DPLL which is able to output a phase signal $PH_2$ which comprises 8 components indicating which of the 8 samples is valid.

In FIG. 4 the phase detector 21 outputs a phase difference signal $\Delta P_2$ which is filtered by the integrating low pass filter 22. The filtered signal FS is fed to the multiplicators 231 through 238. The multiplied signals are fed to the summators 241 through 248. The summated signals $SUM_1$ through $SUM_8$ are then fed to the truncator 25. The summated signal $SUM_8$ is truncated by the truncator and then fed as the truncated signal $T_rS$ to the buffer 26. Truncating in this context means resetting all bits in a bit presentation of the summated signal $SUM_8$ which are more significant than k least significant bits in the bit presentation. If the summated signal $SUM_8$ of DTO_8 has a value of decimal 83, then a bit presentation of that sample of 8 bits is 0101 0011. If k equals 4 than the truncated signal $T_rS$ sample equals 0000 0011, which represents decimal 3. The truncated signal $T_rS$ is clocked into the buffer by clock signal $C_1$, and outputted as the feedback signal FB for one clock cycle of $C_1$. The feedback signal FB is added to the multiplied signals by the summators 241 through 248. Also the phase of the feedback signal FB is compared to the phase of the processed signal PrS by the phase detector 21. The phase signal $PH_1$ contains 8 components $S_1V$ through $S_8V$. The signals $S_1V$ through $S_8V$ indicate which of the 8 samples is valid at a moment indicated by the clock signal $C_1$. Hereinafter a value 1 of these signals indicate that the corresponding sample is valid and may be outputted in the digital signal DS.

The DTO is clocked on frequency C1, which has a lower frequency than C2. A problem arises when a steep transition of the DTO is detected. Because of the slow DTO clock, it is not known which bit in the shift register has to be skipped. That is why DTO values are interpolated to determine more accurately where the steep transition took place. Two methods for interpolating will be discussed.

The first interpolation method uses NC2 number of DTOs. The inputs of the DTOs are multiplied with 1=NC2, 2=NC2. $(NC2_i1)$=NC2. When a DTO detects an overflow, while the previous DTO does not overflow, a steep transition is detected and the bit corresponding to the steep transition has to be skipped.

The second interpolation method uses a look-up table. When successive DTO values are known and a steep transition is detected in between, the two DTO values are combined to an address for the look-up table. The data corresponding to the address indicates which bit has to be skipped. When the DTO exceeds its maximum value, it truncates and returns to its most negative value. A steep transition will never occur exactly on a C2-moment, so a choice has to be made between skipping the bit sampled before or after the steep transition. Which of these 2 bits has to be skipped is not relevant, because both bits will have the same value when no phase jitter is present.

Figure 5A:
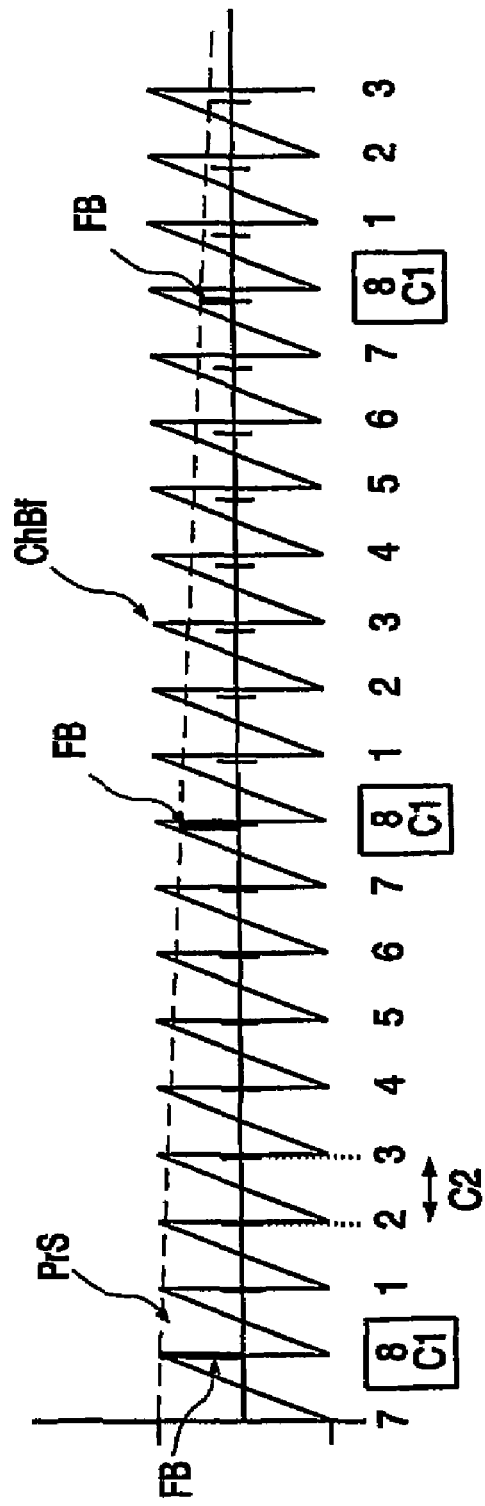
FIG. 5a shows an example of the feedback signal in relation to the processed signal.

In FIG. 5a an example of the processed signal $P_rS$, the feedback signal FB and a signal representing the channel bit frequency ChBf are shown, whereby n equals 8. On the horizontal axis periods of clock signal $C_1$ and clock signal $C_2$ are inserted. The feedback signal FB and the processed signal $P_rS$ are clocked with clock signal $C_1$. Clock signal $C_2$ is included for illustration purposes. In this example the clock signal $C_2$ has a slightly higher frequency than the channel bit frequency ChBf. As a result, the processed signal $P_rS$ is varying relatively slowly. At every clock period of clock signal $C_1$ the feedback signal FB is buffered. The phase detector $PD_2$ 21 tries to synchronize the feedback signal FB with the processed signal $P_rS$. If that is the case, then the momentary amplitude of the feedback signal FB is substantially equal to the amplitude of the processed signal $P_rS$. Because almost all samples obtained by the sample and hold unit 31 may be outputted in the digital signal DS, bits k+1 of subsequent summated signals $SUM_x$ are alternating. This means that the filtered signal FS has a relatively high value. If for example bit k+1 represents a decimal value of 256, then the filtered signal FS has a value of approximately 250. This causes bit k+1 of subsequent summated signals $SUM_x$ through alternate, and the signals $S_1V$ through$S_8V$ have a value 1, indicating all the samples may be outputted.

Figure 5B:
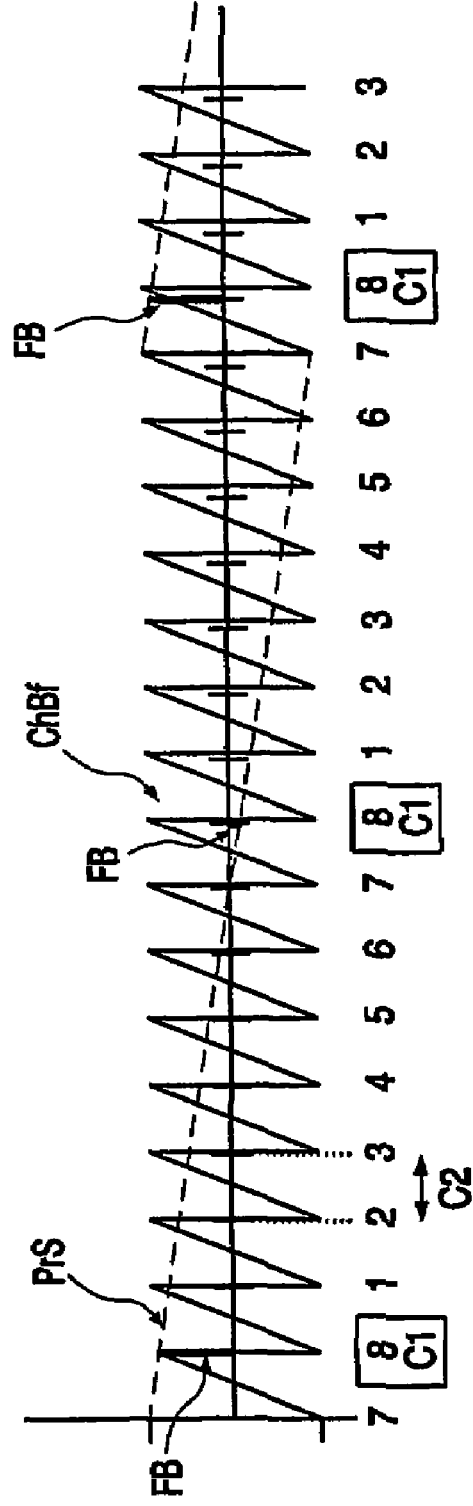
FIG. 5b shows another example of the feedback signal in relation to the processed signal.

In FIG. 5b the channel bit frequency ChBf is substantially lower than the channel bit frequency ChBf of the example shown in FIG. 5a This causes the processed signal $P_rS$ to vary more quickly. As a consequence the frequency of the feedback signal FB decreases in order to synchronize the feedback signal FB with the processed signal $P_rS$. The filtered signal FS is decreased in order to decrease the frequency of the feedback signal FB. The filtered signal FS may, for instance, have a value of 200. At one point bit k+1 of subsequent summated signals $SUM_x$ does not alternate, and the corresponding sample is not outputted.

Figure 6:
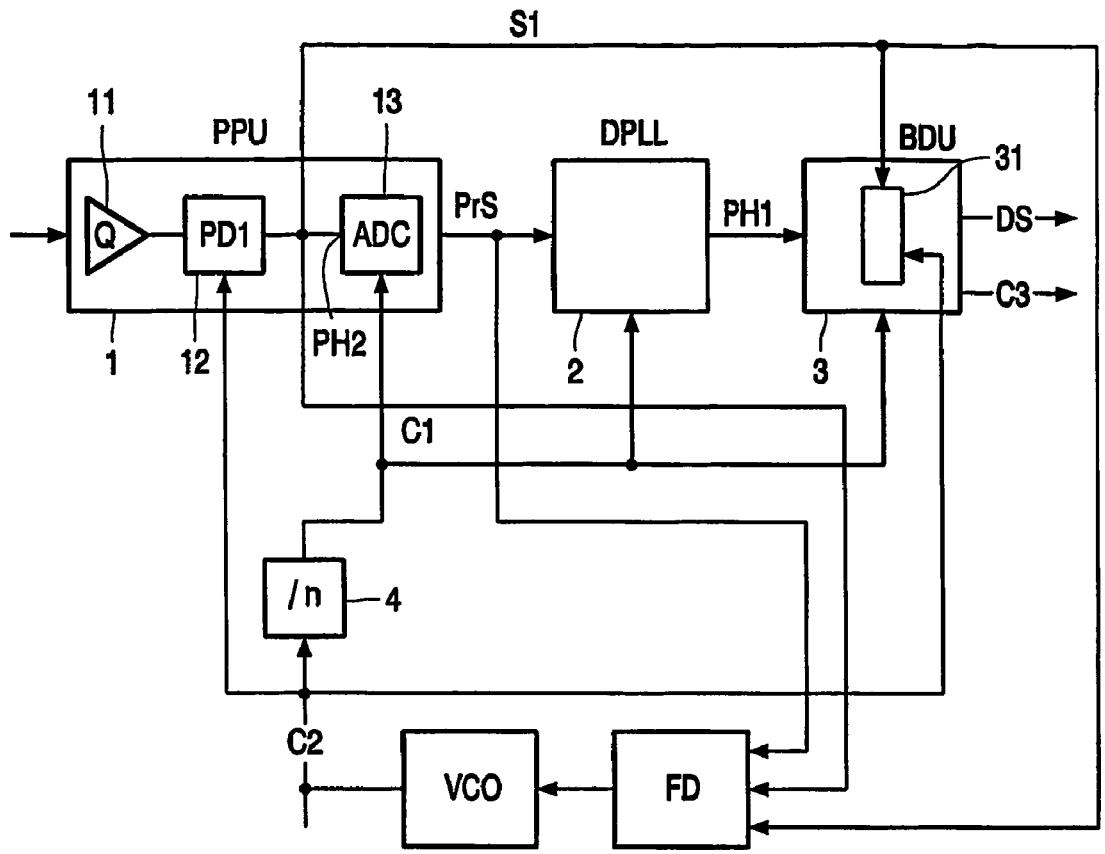
FIG. 6 shows possible embodiments of the bit-detection arrangement comprising a frequency detector and a voltage controlled oscillator.

In the embodiment depicted in FIG. 6 the clock signal $C_2$ is produced by the voltage controlled oscillator VCO. The frequency detector produces the VCO voltage as a function of the frequency of the output signal $PH_2$, or the frequency of the processed signal PrS, or the frequency of the output signal $S_1$. The voltage controlled oscillator VCO and the Frequency detector FD of an embodiment using the frequency of the output signal $PH_2$ or the output signal $S_1$, can be implemented with analog electronics. The frequency detector FD of an embodiment using the processed signal PrS, is preferably implemented with digital circuitry, because the processed signal PrS is digital. Also the relation between the VCO voltage and the frequency of the input signal of the frequency detector FD is dependent on the signal used as the input signal of the frequency detector FD. For instance, the output signal $S_1$ has a higher frequency than the processed signal PrS.

Figure 7:
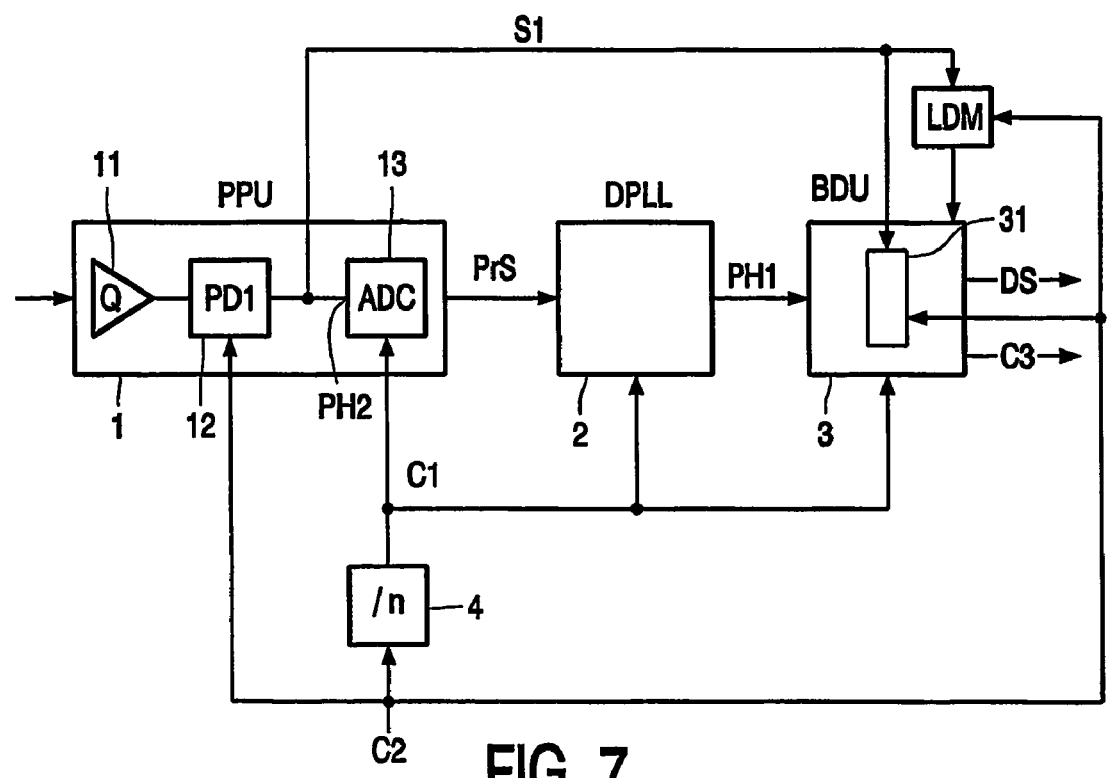
FIG. 7 shows an embodiment of the bit-detection arrangement comprising a location determining means.
Figure 8A:
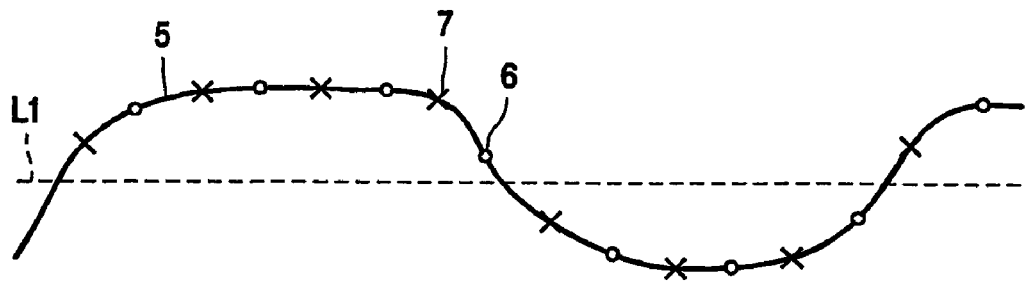
FIG. 8a shows an example of the output signal $S_1$ in relation to the sample moments of clock signal $C_2$, where a sample is taken before zero crossing.
Figure 8B:
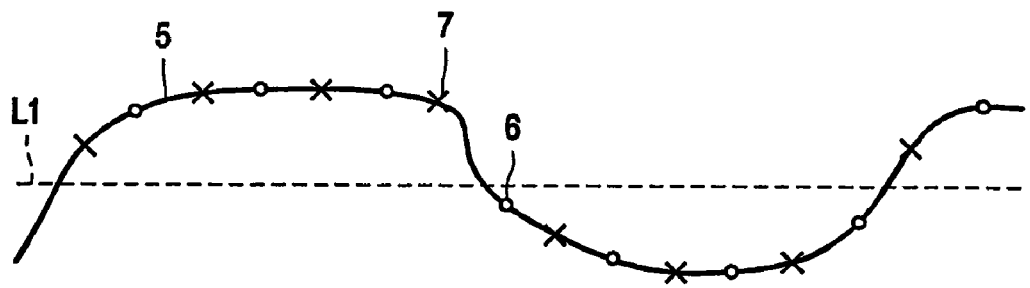
FIG. 8b shows an example of the output signal $S_1$ in relation to the sample moments of clock signal $C_2$, where a sample is taken after zero crossing.

The location determining means LDM in FIG. 7 is able to determine the location of the zero crossing of the output signal $S_1$ and the location of the zero crossing of the clock signal $C_2$. If, as indicated in FIG. 8a, the sample 6 is taken just before the zero crossing of the output signal $S_1$, then the value of the sample is 1. The corresponding channel bit 7 also has a value 1, so the sample has the correct value. If, as indicated in FIG. 8b, the sample 6 is taken just after the zero crossing of the output signal, then the value of the sample is 0. The value of the sample is thus incorrect and may be toggled. The location signal may indicate to the bit decision unit to toggle this sample. The location signal can for instance be a bit-stream with the same frequency as clock signal $C_2$, but with value 0 if the corresponding bit is preferably not to be toggled and a value 1 if the corresponding bit is preferably to be toggled.

Figure 9:
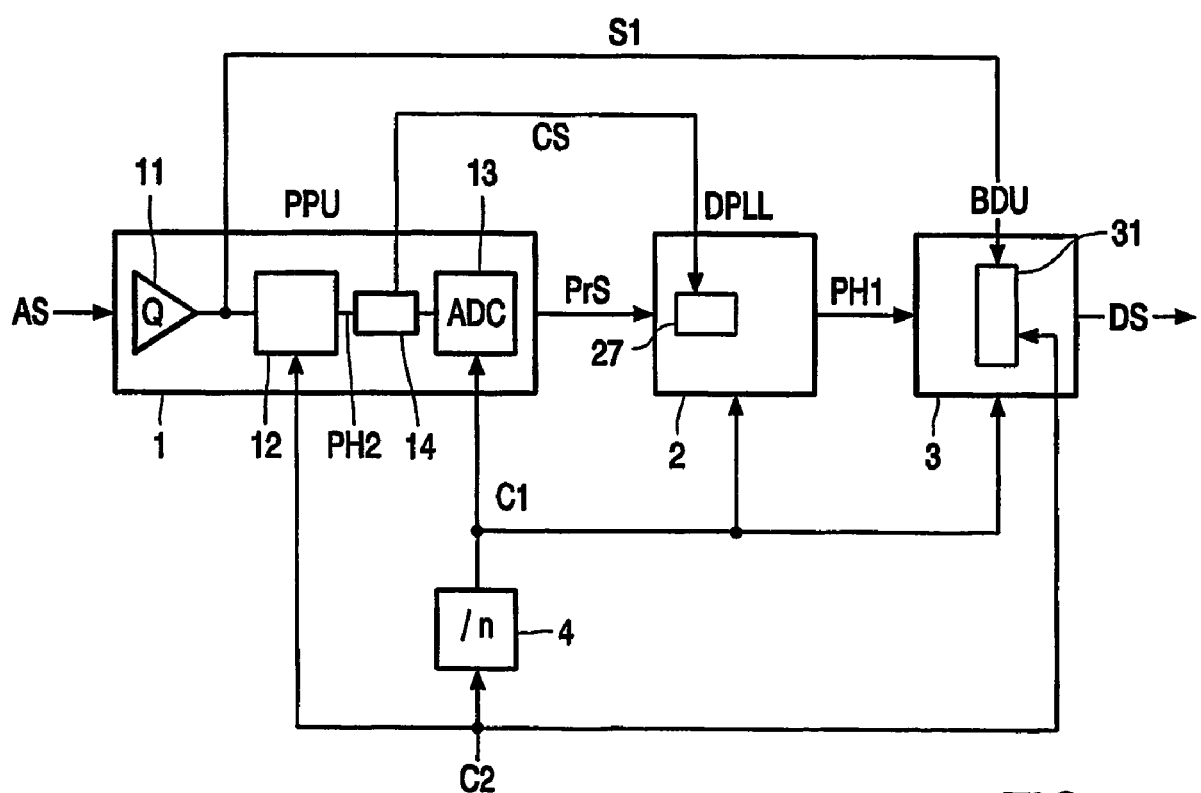
FIG. 9 shows an embodiment of the bit detection arrangement using inverting means.

In FIG. 9 the output signal $PH_2$ is fed to an input of the first conversion means 14. The first inverted signal $CvS_1$ is fed to the analog to digital converter ADC 13. Also a control signal CS is generated by the first conversion means 14. The control signal CS is fed to the second conversion means 27. The second conversion means 27 uses the control signal CS to put back the steep transitions.

Figure 10:
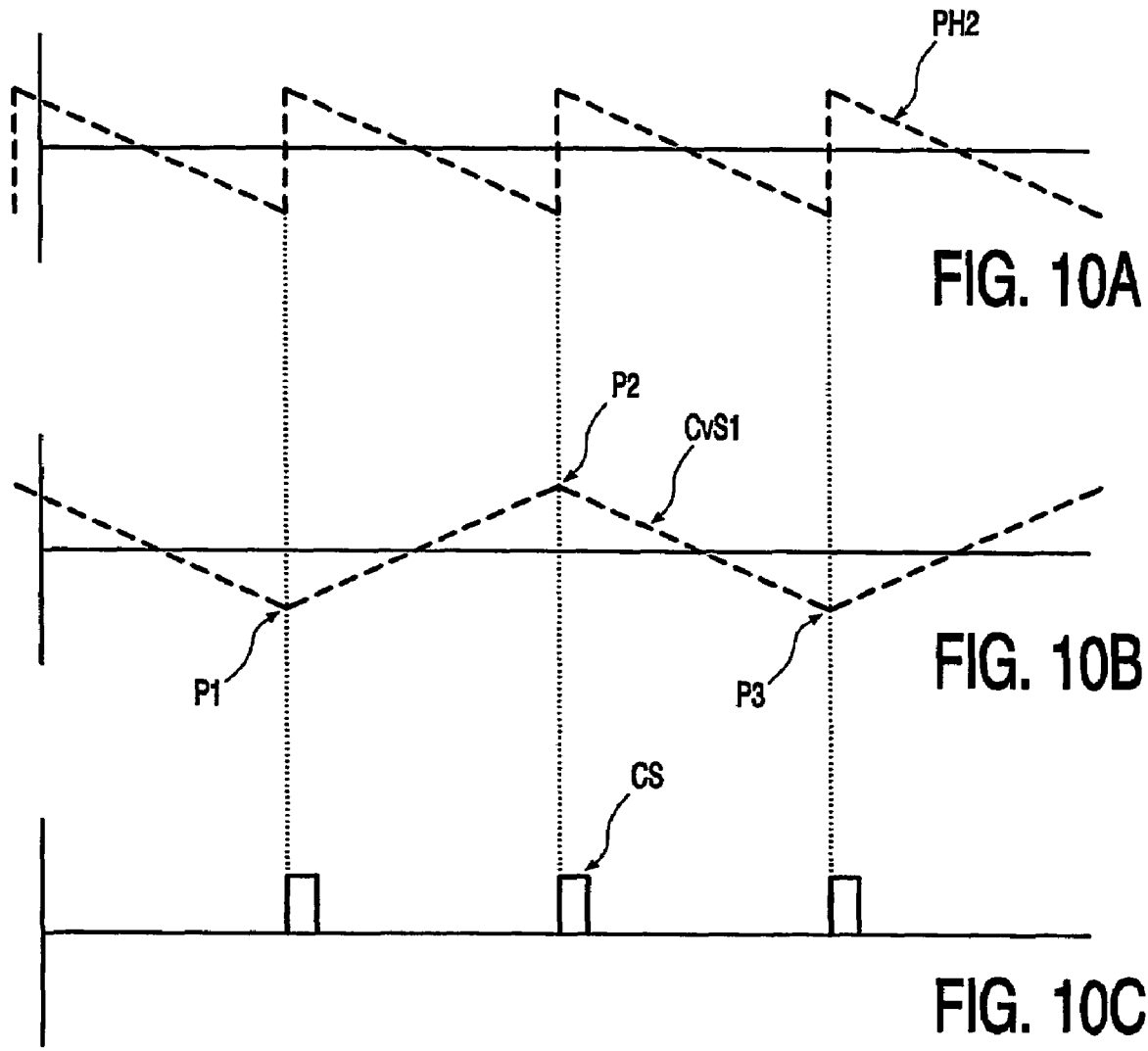

In FIG. 10a the output signal $PH_2$ exhibits several steep transitions. Between point P1 and point P2, as shown in FIG. 10b, the output signal $PH_2$ is inverted, thereby removing the two steep transitions at the points P1 and P2. Also a control signal CS is generated as can be seen in FIG. 10c. In this example the control signal CS contains pulses at the steep transitions. The second conversion means 27 operate in a similar manner.

Figure 11:
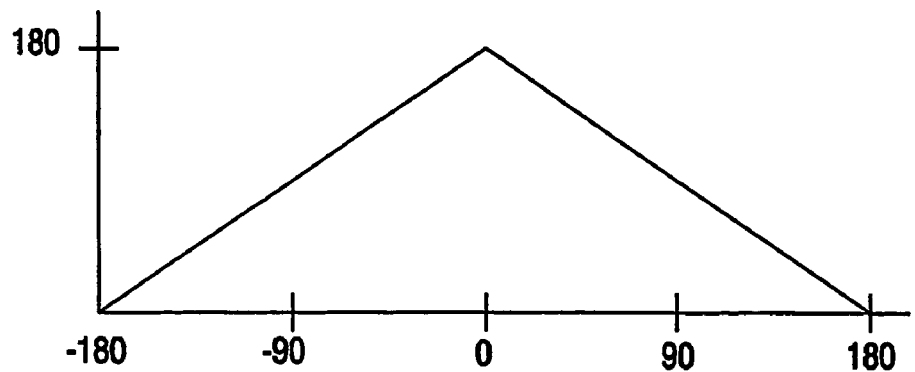
FIG. 11 shows the relation between maximum allowed phase jitter and the phase difference $\Delta P_1$.

The maximum allowed phase jitter with the bit-detection arrangement described in D1 as a function of the phase difference $\Delta P_1$ is shown in FIG. 11. With a phase difference $\Delta P_1$ of 0 degrees the maximum allowed phase jitter is 180 degrees. When the phase difference $\Delta P_1$ is 180 degrees then the maximum allowed phase jitter is 0 degrees.

Figure 12:
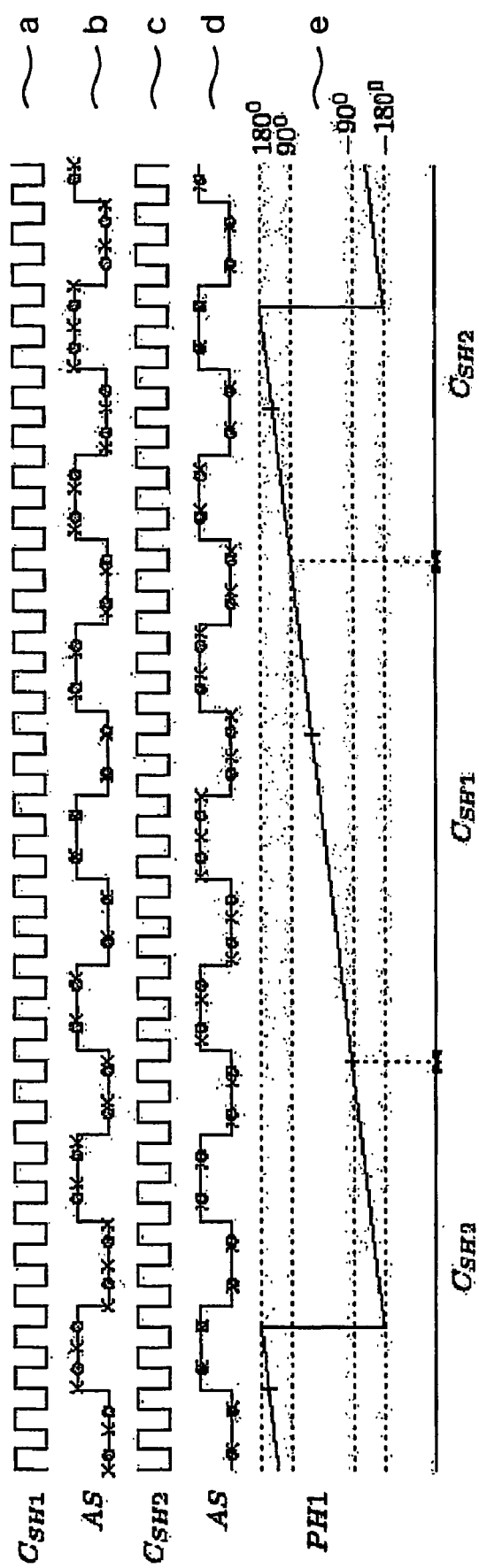

In FIG. 12a an example of the clock signal $C_{SH1}$ is shown. The corresponding sample moments with respect to the analog signal AS is indicated by the crosses 101 in FIG. 12b. The optimal sample moments are indicated by the circles 100. The phase signal PH1 indicating the phase difference between clock signal $C_2$ and the output signal $S_1$ is shown in FIG. 12e. In this example the clock signal $C_{SH1}$ has a phase equal to the phase of clock signal $C_2$. As can be seen by the crosses 101 in FIG. 12b, the first few sample moments dictated by clock signal $C_{SH1}$ are far from optimal. In fact, there is a great chance of bit errors. A little phase jitter will cause already cause bit errors. If the phase signal PH1 is between 90 and 180 degrees then the sample moments dictated by clock signal $C_{SH1}$ can give bit errors with a higher probability of occurrence in the presence of phase jitter. This also holds if the phase signal PH1 is between −90 and −180 degrees. In both cases the phase difference between the clock signal $C_2$ and the output signal $S_1$ is between 90 and 180 degrees, but in one case clock signal $C_2$ is leading with respect to output signal $S_1$, and in the other case clock signal $C_2$ is lagging. If the phase signal PH1 is between −90 and 90 degrees the sample moments dictated by clock signal $C_{SH1}$ are close to optimal.

The clock signal $C_{SH2}$ in FIG. 12d has a phase difference with respect to clock signal $C_{SH1}$ of 180 degrees. In FIG. 12d the sample moments dictated by clock signal $C_{SH2}$ are indicated by the crosses 102. The first few sample moments are close to optimal. If the phase signal PH1 is between 90 and 180 degrees, or between −90 and −180 degrees the sample moments dictated by clock signal $C_{SH2}$ are close to optimal. If the phase signal PH1 is in the range of −90 and 90 degrees these sample moments are far from optimal and bit errors could occur.

Figure 13:
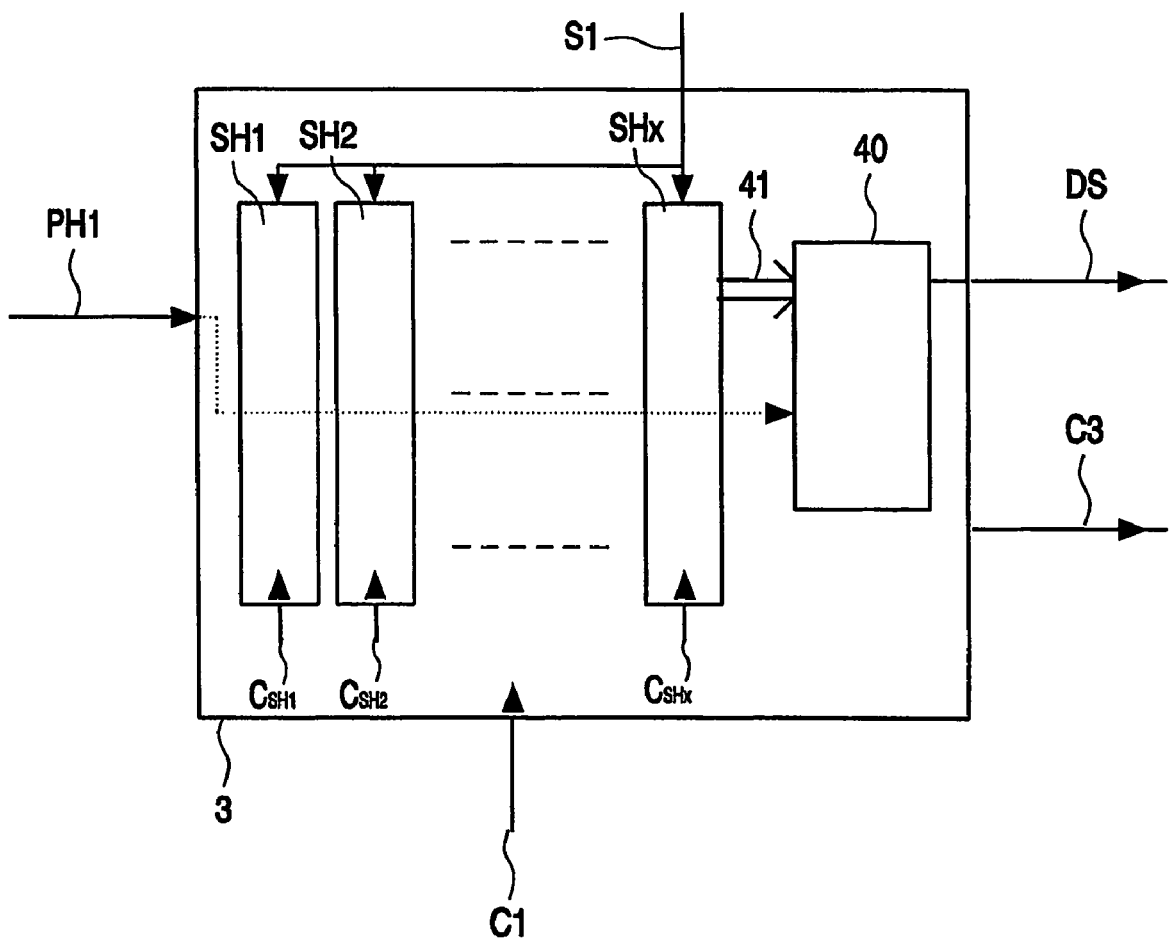
FIG. 13 shows an embodiment of the bit detection unit of the bit-detection arrangement according to the invention.

In order to avoid the bit errors in the presence of phase jitter the bit decision unit of the bit detection arrangement according to the invention is provided with at least two sample and hold units. An example of an embodiment of the bit decision unit is shown in FIG. 13. Here the bit decision unit 3 comprises sample and hold units SH1 through SHx, wherein x is an integer greater than one. The most elementary embodiment comprises two sample and hold units SH1 and SH2. Dependent on the value of the phase signal PH1 samples of one of the sample and hold unit SH1 through SHx are outputted as the digital signal DS. The output unit 40 selects one of the samples 41 coming from the sample and hold units SH1 through SHX in dependence of the phase signal PH1. The output unit 40 selects the samples to output sample by sample depending on the current value of the phase signal PH1. This can mean that for instance the first two samples to output are taken from sample and hold unit SH1, the next two samples from sample and hold unit SH2, the next three samples from sample and hold unit SH1, and so on.

Figure 14:
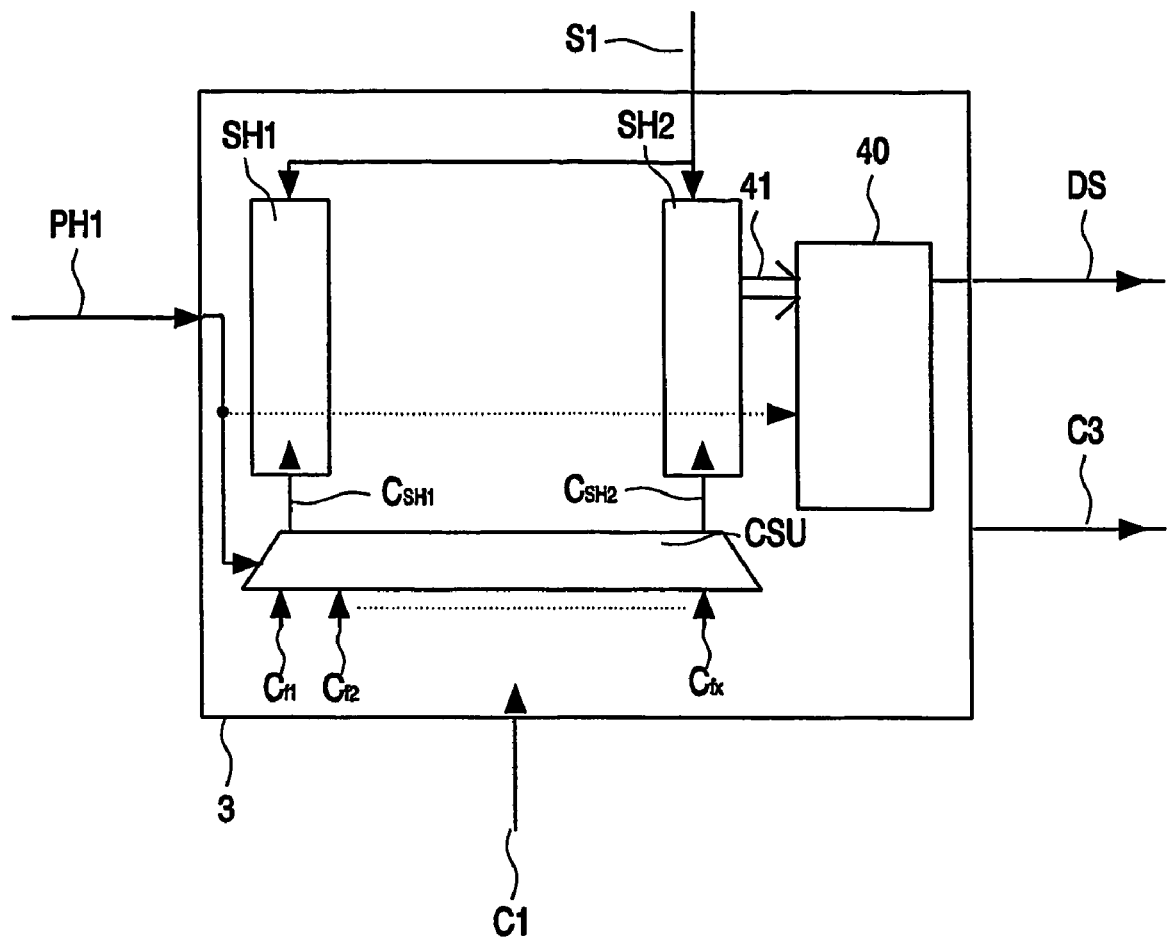
FIG. 14 shows an other embodiment of the bit detection unit of the bit-detection arrangement according to the invention.

An other embodiment of the bit decision unit 3 in accordance with the invention is shown in FIG. 14. Here the bit decision unit comprises two sample and hold units SH1 and SH2. The clock signals $C_{SH1}$ and $C_{SH2}$ are selected by the clock signal selection unit CSU from the clock signals $C_{f1}$ through $C_{fx}$. The frequency of the clock signal $C_{f1}$ through $C_{fx}$ is identical to the frequency of clock signal $C_2$, but the phases of these clock signals differ from each other. In dependence of the value of the phase signal PH1 the clock signals $C_{SH1}$ and $C_{SH2}$ are each connected to one of the clock signals $C_{f1}$ through $C_{fx}$. One of the clock signals $C_{SH1}$ and $C_{SH2}$ is connected to the clock signal which has the optimal phase for the current value of the phase signal PH1. The other clock signal ($C_{SH1}$ or $C_{SH2}$) is connected to the clock signal that has a phase which is optimal for the next region of the phase signal PH1. What the next region will be can be easily predicted. The phase signal will generally have a linear progress.

Figure 15:
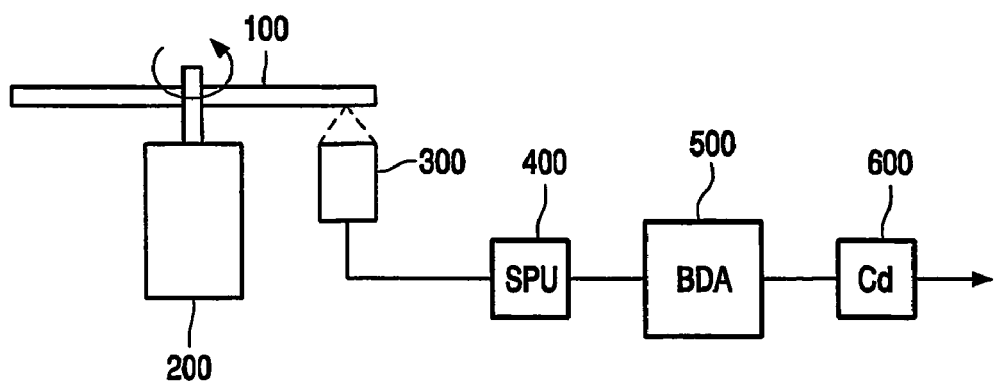
FIG. 15 shows an embodiment of an apparatus for reproducing information provided with a bit-detection arrangement of the invention.

In FIG. 15 the displacement means 200 displaces the information carrier 100 relative to the read head 300. The signal processing unit 400 converts a signal coming from the read head 300 into the analog signal AS. The read head 300 could for instance be a laser unit and a detector for detecting a laser beam reflected by the surface of the information carrier 100. The detector can contain four sub-detection areas. The signal processing unit 400 then performs a summation operation to the signals coming from the sub-detection areas. The analog signal AS is subsequently converted to the digital signal DS by the bit detection arrangement 500 of the invention. Following that conversion, the channel decoding means 600 further decodes the digital signal DS. The digital signal DS can for instance be a EFM coded signal.

The bit-detection arrangement can be implemented in a number of applications and the invention is not limited to the implementation in the apparatus for reproducing information recorded on an information carrier. The bit-detection arrangement can for instance also be implemented in communication applications in general. For instance in telecom applications. Nowadays there are innumerable applications that need bit detection functionality. Especially when high communication speeds are required the bit-detection arrangement according to the invention is preferably used as it relaxes the demands on the A/D converter and still have a low bit error rate.

The invention claimed is:

1. Bit-detection arrangement able to convert an analog signal (AS) having an amplitude into a digital signal (DS) representing a bit sequence from which the analog signal (AS) is derived, comprising:
    a quantizer (11) able to produce an output signal $S_1$ by quantizing the amplitude of the analog signal (AS), and
    a phase detector $PD_1$ (12) able to determine a phase difference $\Delta P_1$ between the output signal $S_1$ and a clock signal $C_2$, and able to generate an output signal $PH_2$ having an amplitude, where the amplitude of $PH_2$ indicates the phase difference $\Delta P_1$,
    an analog to digital converter ADC (13) which is able to output a processed signal (PrS) by sampling the output signal $PH_2$ at a sample rate controlled by a clock signal $C_1$ having a frequency which is equal to the frequency of clock signal $C_2$ divided by a factor n,
    a digital phase locked loop DPLL (2) able to lock on the processed signal (PrS) and able to output a phase signal $PH_1$ using the clock signal $C_1$, and
    a bit decision unit (3) able to output the digital signal (DS) and a clock signal $C_3$ using the phase signal $PH_1$, the clock signal $C_1$ and the output signal $S_1$, comprising a sample and hold unit $SH_1$ able to sample the output signal $S_1$, using a clock signal $C_{SH1}$ having a frequency equal to the frequency of clock signal $C_2$, and to hold n samples, sample$_{y=1}$ through sample$_{y=n}$, of the output signal $S_1$ for a clock period of clock signal $C_1$, n being the division factor of clock signal $C_2$, where n is an integer greater than one, characterized in that the bit decision unit further comprises
    at least one additional sample and hold unit $SH_2$ able to sample the output signal $S_1$, using a clock signal $C_{SH2}$ and wherein the frequency of the clock signal $C_{SH2}$ is equal to the frequency of clock signal $C_{SH1}$ and the phase of clock signal $C_{SH2}$ is substantially different from the phase of clock signal $C_{SH1}$, and
    an output unit for outputting samples of either the sample and hold units $SH_1$ or $SH_2$, wherein the samples of the sample and hold unit $SH_1$ are outputted when the phase signal $PH_1$ indicates that the phase difference $\Delta P_1$ is in a first region and the samples of the additional sample and hold unit $SH_2$ are outputted when the phase signal $PH_1$ indicates that the phase difference $\Delta P_1$ is in a second region.

2. Bit-detection arrangement as claimed in claim 1, characterized in that the phase difference between clock signal $C_{SH1}$ and clock signal $C_{SH2}$ is approximately 180 degrees and the phase of clock signal $C_{SH1}$ is approximately equal to the phase of clock signal $C_2$ and wherein in the first region the phase difference $\Delta P_1$ is between 0 degrees and 90 degrees and in the second region the phase difference $\Delta P_1$ is between 90 degrees and 180 degrees.

3. Bit-detection arrangement as claimed in claim 1, characterized in that the bit decision unit further comprises sample and hold units $SH_3$ through $SH_x$, wherein the sample and hold units $SH_3$ through $SH_x$ are clocked by clock signals $C_{SH1}$ through $C_x$, wherein the frequency of the clock signals $C_{SH2}$ through $C_{SHx}$ is equal to the frequency of clock signal $C_{SH1}$ and the phases of the clock signals $C_{SH1}$ through $C_{SHx}$ are substantially different from each other and in that the output unit is adapted to output samples of the sample and hold units $SH_1$ through $SH_x$, wherein the phase signal $PH_1$ is divided into x regions, x being the number of sample and hold units, and wherein the output unit is able to output samples of the sample and hold unit which corresponds to the region in which the current value of the phase signal $PH_1$ resides.

4. Bit-detection arrangement as claimed in claim 1, characterized in that the bit detection unit further comprises a clock signal selection unit for outputting the clock signal $C_{SH1}$ and clock signal $C_{SH2}$ wherein the clock signal selection unit is able to change the phases of the clock signals $C_{SH1}$ and $C_{SH2}$ in dependence of the current value of the phase signal $PH_1$.

5. Bit-detection arrangement as claimed in claim 4, characterized in that the clock signal selection unit is fed with clock signals $C_{f1}$ through $C_{fx}$ having a frequency equal to clock signal $C_2$ and wherein the phases of the clock signals $C_{f1}$ through $C_{fx}$ differ from each other, and wherein the clock signal selection unit passes two of the clock signals $C_{f1}$ through $C_{fx}$ through as the clock signals $C_{SH1}$ and $C_{SH2}$ in dependence of the phase signal $PH_1$.

6. Apparatus for reproducing information recorded on an information carrier, provided with the bit-detection arrangement as claimed in claim 1.

* * * * *